United States Patent [19]
Devin et al.

[11] Patent Number: 5,303,189
[45] Date of Patent: Apr. 12, 1994

[54] HIGH-SPEED MEMORY WITH A LIMITER OF THE DRAIN VOLTAGE OF THE CELLS

[75] Inventors: Jean Devin; Emilio Yero, both of Aix En Provence; Claude Costabello, Marseille, all of France

[73] Assignee: SGS-Thomson Microelectronics S.A., Gentilly, France

[21] Appl. No.: 663,410

[22] Filed: Mar. 1, 1991

[30] Foreign Application Priority Data

Mar. 5, 1990 [FR] France .............................. 90-02737

[51] Int. Cl.$^5$ .............................................. G11C 11/34
[52] U.S. Cl. ........................... 365/189.06; 365/189.07; 365/189.09; 365/185
[58] Field of Search .............. 365/189.06, 189.07, 365/189.09, 185

[56] References Cited

U.S. PATENT DOCUMENTS

| | | | |
|---|---|---|---|
| 3,765,002 | 10/1973 | Basse | 340/173 CA |
| 4,694,429 | 9/1987 | Tanaka et al. | 365/189.06 |
| 4,843,594 | 6/1989 | Tanaka et al. | 365/185 |
| 4,860,256 | 8/1989 | Devin et al. | 365/189 |
| 4,947,375 | 8/1990 | Gaultier et al. | 365/200 |
| 5,027,320 | 6/1991 | Pathak et al. | 365/189.06 |

FOREIGN PATENT DOCUMENTS 0329141 8/1989 European Pat. Off. .

Primary Examiner—Margaret R. Wambach
Attorney, Agent, or Firm—Robert Groover

[57] ABSTRACT

An erasable and electrically programmable memory with only few cells works at high speed in reading mode and is reliable. This is achieved by using a voltage limiter that limits the variation in the drain voltage of the memory cells.

31 Claims, 1 Drawing Sheet

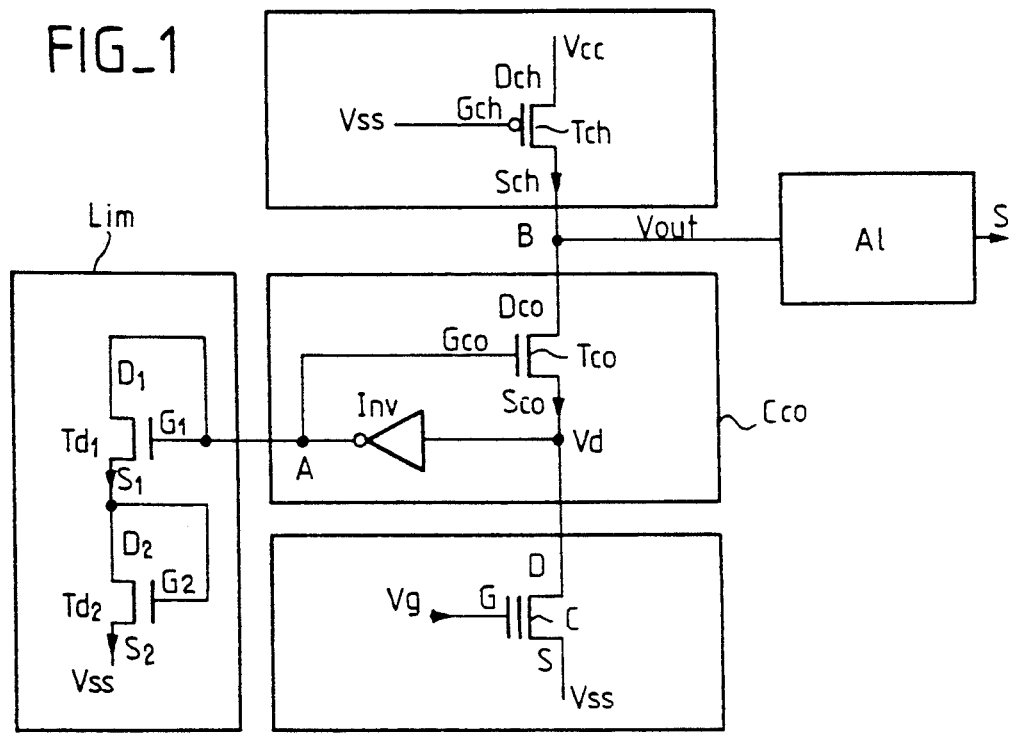
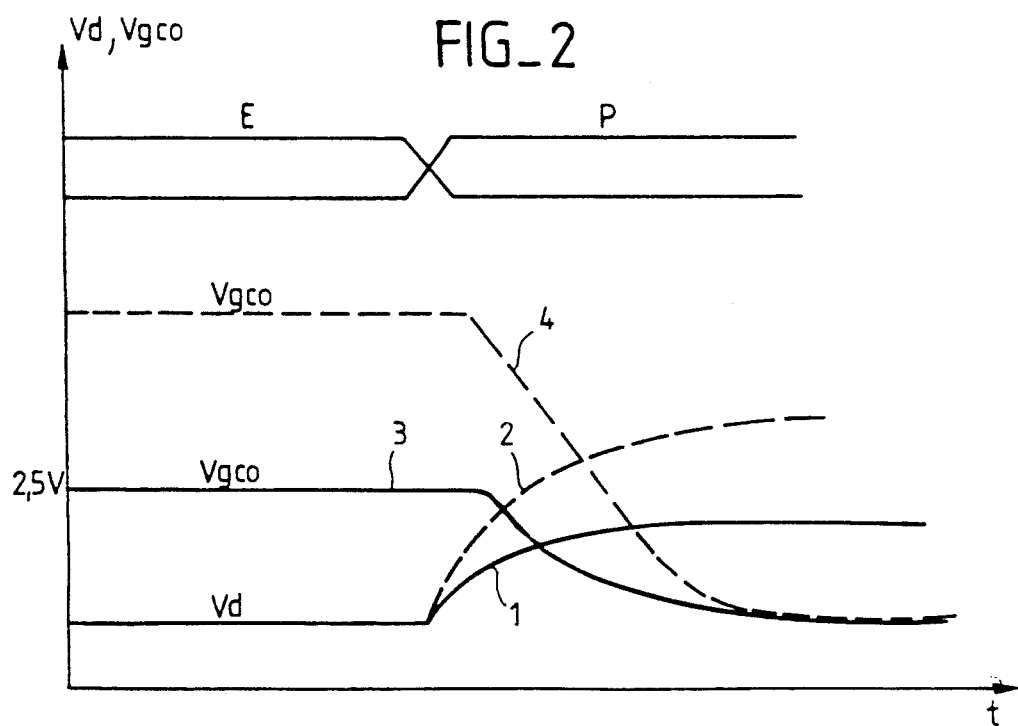

HIGH-SPEED MEMORY WITH A LIMITER OF THE DRAIN VOLTAGE OF THE CELLS

BACKGROUND OF THE INVENTION

1. Field of the Invention

The invention relates to a drain voltage limiter designed for a low-capacity, erasable, electrically programmable MOS memory that works at high speed in reading mode.

2. Description of the Prior Art

Electrically programmable memory cells are constituted by a floating gate transistor with its control gate connected to a word line, its drain connected to a bit line and its source connected to a reference potential that is generally the electrical ground of the circuit.

The cells are organized in matrix form: the transistors (or memory cells) are arranged in rows and columns. The transistors of a given row have their control gates connected to one and the same word line, and the transistors of a given column have their drains connected to one and the same bit line. A memory cell is addressed through the addressing of a bit line and a word line.

The programming or erasure of a memory cell consists in the injection of electrical charges into the floating gate, or in making them leave the floating gate, by the application, for example, of high potentials, erasure by ultraviolet rays, etc. These are well known methods.

The quantity of charges stored at the floating gate determines the threshold voltage Vs of the transistor: in terms of absolute value, this is the minimum voltage that must be applied between the gate and the source for the cell to become conductive. For an N channel transistor, for example, a threshold voltage for an erased state may be two volts and a threshold voltage for a programmed state may be eight volts. Thus, if a reading voltage of the order of five volts is applied between the source and the drain, the cell conducts a current of about a hundred microamperes if it is erased, and it is not conductive if it is programmed.

The current conducted by the cell is very low. Hence, to read the state of the cell, there has to be a current/voltage conversion. In a simple, well-known structure, the bit line is pre-loaded by a current generator which takes the drain to a potential close to Vcc. The current generator will conventionally be formed by a resistive transistor with zero threshold voltage, the gate and the source of this transistor being short-circuited. When a reading voltage is applied between the source and the gate of the cell, if the cell is conductive it will make its drain tend towards 0 volts. If it is not conductive, the drain remains at the same pre-loading voltage, close to Vcc. A reading amplifier, centered on a detection threshold ranging from 0 to 5 volts, may then detect an erased state or a programmed state.

Because of the matrix organization of the memories, the bit lines, which have many cells and are all connected to the reading amplifier, are highly capacitive: in parallel, at the drain and the source (grounded), it is possible to represent the equivalent capacitance. The cell, for its part is highly resistive: the current that flows is very low. It follows therefrom that it takes very long for the data of a memory cell to be set up on the bit line. This is so above all if it is necessary to read a state opposite the one pre-positioned on the bit line, i.e. an erased state while the bit line is pre-positioned in a programmed state by the pre-load circuit (current generator).

Furthermore, the drain of the cell undergoes major variations in voltage: for example, when the cell is in an erased state, its drain pre-positioned at Vcc goes to 0 volts when is being read. Repeated reading operations then tend to modify the quantity of charges stored at the floating gate; the cell tends to be programmed. Its lifetime becomes shorter. This is a phenomenon of stress of the cell. It is particularly pronounced when the gate lengths are small (submicron).

Hence, a circuit has been introduced between the bit line and the drain of the cell. This circuit has the function of absorbing the difference in voltage prompted by the reading of an erased state, the bit line being pre-positioned for a programmed state: the potential of the drain of the memory cell varies to a far smaller extent. This circuit for limiting the voltage variation of the drain is, in a known way, formed by a transistor that shall be called a compensation transistor, series connected between the bit line and the drain of the memory cell. The source of this transistor is therefore connected to the drain of the cell. This source is also the input of a follower-inverter the output of which is connected to the gate of the compensation transistor. The drain of the compensation transistor is connected to the input of the reading circuit and to the output of the pre-load circuit.

This compensation transistor is more resistive than the memory cell, but is less so than the pre-load transistor.

Thus, if the cell is in an erased state and if the reading voltage is applied to its gate, the current of the cell becomes high and tends to make its drain voltage Vd diminish. Because of the follower-inverter, the gate voltage of the compensation transistor, for its part, becomes greater: this transistor is increasingly conductive, equivalent to a short-circuit.

By contrast, if the cell is in a programmed state, it becomes highly resistive. Since the compensation transistor is more resistive, and because of the inverter, the compensation transistor becomes highly resistive, more so than the cell, and takes the voltage difference at its terminals: Vd therefore undergoes very little variation.

However, while the stress effect has thus been limited, the problem of access time in reading mode, which is lengthy because of the capacity, is not resolved for all that even if, since the voltage variation is smaller, the access time is also shorter (CdV=idt).

An object of the invention is the use of an assembly such as this, with compensation transistor, for a small number of cells, in order to have a memory that is very fast in reading mode. The capacitance induced is smaller, for there are fewer cells. However, it is then the transmission time of the inverter that will hamper fast switching-over: the compensation does not follow and, in practice, there are voltage peaks on the drain, for the induced capacitance is too low. Thus, using the known approach, the problem of stress of the cell is encountered again.

SUMMARY OF THE INVENTION

An object of the invention, therefore, is an erasable and electrically programmable memory, organised matricially in rows and columns, each column being selected by a bit line and having several memory cells, each bit line having a pre-load circuit, a compensation circuit being placed in series between the bit line and each of the cells of the corresponding column, the compensation circuit including a compensation transistor and an inverter, the output of which controls the gate of the compensation transistor, wherein the gate voltage of the compensation transistor is furthermore restricted by a voltage limiter.

BRIEF DESCRIPTION OF THE DRAWINGS

Other characteristics and advantages of the invention shall be presented in the following description, given by way of a non-restrictive indication of the invention and made with reference to the appended drawings, of which:

FIG. 1 is an electrical diagram of a cell reading circuit according to the invention; and FIG. 2 is a graph of the variations of the drain voltage.

DETAILED DESCRIPTION OF THE INVENTION

FIG. 1 shows an exemplary embodiment of a memory cell reading circuit, enabling a fast switching over of the data on the bit line, without putting the memory cells under stress.

A memory cell C has a gate G, a drain D and a source S. The potential of the drain is Vd, that of the gate is Vg and that of the source is Vss, the electrical ground of the circuit. The gate G is connected to the respective word line.

A compensation transistor Tco has a gate Gco, a drain Dco and a source Sco. It is more resistive than the memory cell C.

A pre-load transistor Tch has a gate Gch, a drain Dch and a source Sch. The potential of the drain Dch is Vcc, the supply voltage of the circuit. When the bit line B is selected in reading mode, the potential of the gate Gch is taken to the electrical ground of the circuit, Vss. The pre-load transistor Tch is more resistive than the compensation transistor Tco.

The pre-load transistor Tch, the compensation transistor Tco and the memory cell C are series-connected between Vcc and Vss (the circuit ground). The source Sch of the pre-load transistor Tch is connected to the drain Dco of the compensation transistor Tco; the source Sco of the compensation transistor Tco is connected to the drain D of the memory cell C; the drain Dch and the source S are furthermore connected, as we have seen, to Vcc and Vss respectively.

The point of connection of bit line B between the source Sch of the pre-load transistor and the drain Dco of the compensation transistor is also the output Vout read by a reading amplifier A1.

The source Sco of the compensation transistor Tco is furthermore connected to the input of a follower-inverter Inv, the output A of which is connected to the gate Gco of this very same compensation transistor. The transistor Tco and the follower-inverter Inv form a compensation circuit Cco.

The output A of the invert Inv of the compensation circuit Cco is also connected to a voltage limiter Lim. This limiter prevents the voltage at the point A and, therefore, the voltage of the gate Gco, from rising above the limit voltage that it imposes.

In the example, this limiter is formed by two transistors mounted as diodes. Transistor Td1 has a gate G1, a drain D1 and a source S1. Transistor Td2 has a gate G2, a drain D2 and a source S2. The respective gates G1 and G2 of each transistor are connected to the respective drains D1 and D2. The two transistors Td1 and Td2 are series connected between the point A and the electrical ground of the circuit Vss. The drain D1 (and therefore the gate G1) is connected to the point A, the output of the follower-inverter Inv; the source S1 is connected to the drain D2; the source S2 is connected to the electrical ground of the circuit Vss.

Since the two voltage limiting transistors are mounted as diodes and forward based, the maximum voltage between the drain and the source of each of them is equal to their respective threshold voltage. In all, the maximum voltage between point A and Vss is therefore equal to the sum of the threshold voltage V1 of transistor Td1 and the threshold voltage V2 of transistor Td2, for example 2.5 volts. Depending on the desired limit voltage value, it is possible to place a greater number or a smaller number of transistors thus mounted as diodes.

Thus, let us assume that the cell C is in an erased state. The pre-loaded bit line is positioned for a programmed state: Vout is substantially equal to Vcc. If a reading voltage, for example a voltage of five volts, is imposed on the gate G of the memory cell (Vg=5 v), the cell becomes conductive: it makes its drain voltage Vd tend towards the ground Vss.

At the output of the inverter, the voltage of the gate Gco tends, for its part, to increase, with a certain delay due to the time taken to switch the inverter INV. The compensation transistor Tco becomes increasingly conductive and its impedance decreases: it tends to be a short-circuit and Vout tends towards the ground Vss.

However, the voltage of the gate Gco does not continue to increase: once the voltage reaches the value dictated by the limiter, it remains at this value. The voltage Vd, for its part, is also blocked at the corresponding reverse value up to the end of the reading operation.

When the cell is in a programmed state, the cell read will be highly resistive. It lets through very little current, and its drain potential Vd tends to increase. The voltage of the gate Gco becomes inversely very low. Since the transistor Tco is more resistive than the memory cell C, it prevents the drain voltage Vd from increasing, and it is this transistor Tco that absorbs the greatest voltage difference. Vd therefore undergoes very little variation.

Through this assembly, which limits the value of the drain voltage and its variation, the variations due to the fast switching-over between the programmed state and the erased state are reduced. This is what is shown in FIG. 2, in which the curves of variations in the voltage drain Vd of the memory cell and the voltage Vgco of the gate Gco of the compensation transistor Tco are represented by solid lines 1 and 3, respectively. Dashes are also used to show the curves, 2 and 4, of variations in Vd and Vgco which were obtained without a limiter LIM.

If we start with an erased state (E), we have the voltage Vgco of the gate Gco which is high and the voltage Vd of the drain D which is low. When there is a switch-over to a programmed state (P), Vd becomes high and Vgco becomes low. The lower the value of Vgco for the erased state, the shorter is the rise time available to Vd since the compensation transistor Tco is more resistive than the memory cell C. The variation of Vd is therefore limited by using a limiter of the voltage Vgco: we then have a low-density memory, i.e. one with few memory cells, with high-speed access but without any sacrificing of reliability since the cells undergo no stress.

What is claimed is:

1. An erasable and electrically programmable memory, comprising:

an array of rows and columns, each column having a plurality of memory cells and a respective bit line, and each said bit line having a respective preload circuit;

a respective compensation circuit connected in series between each of said memory cells and the respective bit line of said corresponding column, each said compensation circuit including a compensation transistor and an inverter, wherein an output of said inverter is connected to a gate of said compensation transistor; and a voltage limiter connected to said gate of said compensation transistor to prevent the value of the voltage at said gate of said compensation transistor from rising above a limit voltage imposed by said voltage limiter.

2. A memory in accordance with claim 1 wherein said voltage limiter comprises at least one current limiting transistor mounted as a diode, imposing a limit voltage equal to the threshold voltage of said at least one current limiting transistor.

3. A memory in accordance with claim 1 wherein said voltage limiter comprises at least two current limiting transistors connected in series, each current limiting transistor being mounted as a diode, such that said voltage limiter imposes a limit voltage equal to the sum of the threshold voltages of said at least two current limiting transistors.

4. A memory in accordance with claim 1 wherein said voltage limiter comprises first and second current limiting transistors connected in series between the gate of the compensation transistor and a reference voltage, with a drain of the first current limiting transistor being connected to the gate of the compensation transistor, a drain of the second current limiting transistor being connected to a source of the first current limiting transistor, a source of the second current limiting transistor being connected to said reference voltage, a gate of the first current limiting transistor being connected to the drain of the first current limiting transistor, and a gate of the second current limiting transistor being connected to the drain of the second current limiting transistor.

5. A memory in accordance with claim 1 wherein each memory cell is a floating gate transistor having a floating gate, a control gate connected to an associated word line, a drain connected to the associated bit line, and a source connected to a reference potential.

6. A memory in accordance with claim 1 wherein each compensation transistor is more resistive than each memory cell, a drain of each compensation transistor is connected to the respective bit line, a source of each compensation transistor is connected to each of the memory cells in the column associated with the respective bit line, and the source of each compensation transistor is also connected to an input of the respective inverter.

7. A memory in accordance with claim 6 wherein said voltage limiter comprises at least one current limiting transistor connected as a diode, imposing a limit voltage equal to the threshold voltage of said at least one current limiting transistor.

8. A memory in accordance with claim 6 wherein said voltage limiter comprises at least two current limiting transistors connected in series, each current limiting transistor being connected as a diode, such that said voltage limiter imposes a limit voltage equal to the sum of the threshold voltages of said at least two current limiting transistors.

9. A memory in accordance with claim 6 wherein said voltage limiter comprises first and second current limiting transistors connected in series between the gate of the compensation transistor and a reference voltage, with the drain of the first current limiting transistor being connected to the gate of a compensation transistor, a drain of the second current limiting transistor being connected to a source of the first current limiting transistor, a source of the second current limiting transistor being connected to said reference voltage, a gate of the first current limiting transistor being connected to the drain of the first current limiting transistor, and a gate of the second current limiting transistor being connected to the drain of the second current limiting transistor.

10. A memory in accordance with claim 9 wherein a reading amplifier is connected to the bit line to read the selected memory cell.

11. A memory in accordance with claim 10 wherein each memory cell is a floating gate transistor having a floating gate, a control gate connected to an associated word line, a drain connected to the associated bit line, and a source connected to a reference potential.

12. A memory in accordance with claim 1 wherein a reading amplifier is connected to the bit line to read the selected memory cell.

13. A memory in accordance with claim 1 wherein the pre-load circuit comprises a pre-load transistor connected between a supply voltage and the bit line, with a gate of the pre-load transistor being connectable to a reference voltage when the associated bit line is selected.

14. A memory in accordance with claim 13 wherein said compensation transistor is more resistive than each memory cell and said pre-load transistor is more resistive than said compensation transistor.

15. A memory in accordance with claim 1 wherein the pre-load circuit comprises a pre-load transistor connected between a supply voltage and the bit line, with a gate of the pre-load transistor being connectable to a reference voltage when the associated bit line is selected; wherein the pre-load transistor, the compensation transistor, and each memory cell associated with a bit line are connected in series between the supply voltage and the reference voltage.

16. A memory in accordance with claim 1 wherein the pre-load circuit comprises a pre-load transistor, with a drain of the pre-load transistor being connected to a supply voltage, a source of the pre-load transistor being connected to the associated bit line, and a gate of the pre-load transistor being connectable to a memory ground when the associated bit line is selected; wherein the pre-load transistor, the compensation transistor, and each memory cell associated with a bit line are connected in series between the supply voltage and the memory ground, with a drain of the compensation transistor being connected to the respective bit line, a source of the compensation transistor being connected to a first terminal of each of the memory cells in the column associated with the respective bit line, the source of the compensation transistor being also connected to an input of the respective inverter, and another other terminal of each of the memory cells in the column associated with the respective bit line being connected to the memory ground.

17. A memory in accordance with claim 16 wherein a reading amplifier is connected to the bit line to read the selected memory cell.

18. A memory in accordance with claim 17 wherein said voltage limiter comprises at least one current limiting transistor connected as a diode, imposing a limit voltage equal to the threshold voltage of said at least one current limiting transistor.

19. A memory in accordance with claim 17 wherein said voltage limiter comprises at least two current limiting transistors connected in series, each current limiting transistor being connected as a diode, such that said voltage limiter imposes a limit voltage equal to the sum of the threshold voltages of said at least two current limiting transistors.

20. A memory in accordance with claim 17 wherein said voltage limiter comprises first and second current limiting transistors connected in series between the gate of the compensation transistor and a reference voltage, with a drain of the first current limiting transistor being connected to the gate of a compensation transistor, the drain of the second current limiting transistor being connected to a source of the first current limiting transistor, a source of the second current limiting transistor being connected to said reference voltage, a gate of the first current limiting transistor being connected to the drain of the first current limiting transistor, and a gate of the second current limiting transistor being connected to the drain of the second current limiting transistor.

21. A memory in accordance with claim 20 wherein each compensation transistor is more resistive than each memory cell and each pre-load transistor is more resistive than each compensation transistor.

22. A memory in accordance with claim 21 wherein each memory cell is a floating gate transistor having a floating gate, a control gate connected to an associated word line, a drain connected to the associated bit line, and a source connected to a reference potential.

23. A high-speed nonvolatile memory integrated circuit, comprising:
an array, arrange in rows and columns, of N-channel floating-gate memory cells;
multiple conductive wordlines and bitlines within said array, said wordlines running parallel to said rows and said bitlines running parallel to said columns; and pre-load and read circuitry operatively connected to each of said bitlines;
said memory cells each having a source connected to ground, and a gate connected to a respective one of said wordlines;
each said memory cell being operatively connected to a respective compensation circuit comprising
a respective N-channel compensation transistor,
an inverter connected from drain to gate of said compensation transistor, and
a voltage limiter circuit connected to said gate of said compensation transistor.

24. The integrated circuit of claim 23, wherein said voltage limiter circuit comprises a plurality of diode-connected transistors.

25. The integrated circuit of claim 23, wherein said voltage limiter circuit comprises exactly two diode-connected N-channel transistors.

26. The integrated circuit of claim 23, wherein said compensation transistor is more resistive than a respective transistor of each said memory cell.

27. A high-speed nonvolatile memory integrated circuit, comprising:
an array, arranged in rows and columns, of N-channel floating-gate memory cells;
multiple conductive wordlines and bitlines within said array, said wordlines running parallel to said rows and said bitlines running parallel to said columns; and read circuitry, and a P-channel load transistor, operatively connected to each of said bitlines;
said memory cells each having a source connected to ground, and a gate connected to a respective one of said wordlines;
each said cell being operatively connected to a respective compensation circuit comprising
a respective N-channel compensation transistor, which is more resistive than a respective transistor of each said memory cell
an inverter connected from drain to gate of said compensation transistor, and
a voltage limiter circuit connected to said gate of said compensation transistor, and configured to limit the maximum voltage at said gate of said compensation transistor.

28. The integrated circuit of claim 27, wherein said voltage limiter circuit comprises a plurality of diode-connected transistors.

29. The integrated circuit of claim 27, wherein said voltage limiter circuit comprises exactly two diode-connected N-channel transistors.

30. The integrated circuit of claim 27, wherein said load transistor is more resistive than each said compensation transistor.

31. A method for operating a high-speed nonvolatile memory integrated circuit which includes an array of N-channel floating-gate memory cells, and multiple conductive wordlines and bitlines within said array, and read circuitry operatively connected to each of said bitlines, comprising the operations of;
driving at least one of said wordlines to select multiple ones of said memory cells in a row of the array;
loading at least one selected bitline, and using said read circuitry to sense the resulting voltage of said selected bitline, said bitline being connected to said floating-gate memory cell through a respective compensation circuit comprising a respective N-channel compensation transistor, which is more resistive than said respective floating-gate transistor of said cell, and an inverter connected from drain to gate of said compensation transistor; and
continually limiting the voltage at said gate of said compensation transistor, thereby limiting the maximum voltage at said gate of said compensation transistor.

* * * * *